United States Patent
Bhunia et al.

(10) Patent No.: US 9,685,958 B2
(45) Date of Patent: Jun. 20, 2017

(54) DEFENSE AGAINST COUNTERFEITING USING ANTIFUSES

(71) Applicant: CASE WESTERN RESERVE UNIVERSITY, Cleveland, OH (US)

(72) Inventors: Swarup Bhunia, Cleveland, OH (US); Abhishek Basak, Cleveland, OH (US); Yu Zheng, Cleveland, OH (US)

(73) Assignee: Case Western Reserve University, Cleveland, OH (US)

( * ) Notice: Subject to any disclaimer, the term of this patent is extended or adjusted under 35 U.S.C. 154(b) by 0 days.

(21) Appl. No.: 14/542,325

(22) Filed: Nov. 14, 2014

(65) Prior Publication Data

US 2015/0130506 A1 May 14, 2015

Related U.S. Application Data

(60) Provisional application No. 61/904,255, filed on Nov. 14, 2013.

(51) Int. Cl.
| | |
|---|---|
| *H03K 19/177* | (2006.01) |
| *G01R 27/02* | (2006.01) |
| *G11C 17/16* | (2006.01) |
| *H01L 23/525* | (2006.01) |
| *H01L 23/544* | (2006.01) |
| *G11C 17/18* | (2006.01) |
| *H01L 23/538* | (2006.01) |
| *H01L 23/00* | (2006.01) |
| *H01L 23/62* | (2006.01) |

(52) U.S. Cl.
CPC ..... *H03K 19/17768* (2013.01); *G01R 27/025* (2013.01); *G11C 17/16* (2013.01); *G11C 17/18* (2013.01); *H01L 23/5252* (2013.01); *H01L 23/5382* (2013.01); *H01L 23/544* (2013.01); *H01L 23/573* (2013.01); *H01L 23/576* (2013.01); *H01L 24/49* (2013.01); *H03K 19/17704* (2013.01); *H03K 19/17724* (2013.01); *H01L 23/62* (2013.01); *H01L 24/32* (2013.01); *H01L 24/48* (2013.01); *H01L 24/73* (2013.01); *H01L 2223/5444* (2013.01); *H01L 2224/05554* (2013.01); *H01L 2224/32225* (2013.01); *H01L 2224/48091* (2013.01); *H01L 2224/48227* (2013.01); *H01L 2224/49* (2013.01); *H01L 2224/73265* (2013.01); *H01L 2924/00014* (2013.01); *H01L 2924/15184* (2013.01); *H01L 2924/15311* (2013.01); *H01L 2924/181* (2013.01); *H01L 2924/19107* (2013.01)

(58) Field of Classification Search
CPC ............... H03K 19/17768; G01R 27/025
USPC ............... 326/8, 16, 37, 38; 327/525
See application file for complete search history.

(56) References Cited

U.S. PATENT DOCUMENTS

| | | | |
|---|---|---|---|
| 6,351,425 B1* | 2/2002 | Porter | 365/225.7 |
| 2011/0156801 A1* | 6/2011 | Tong et al. | 327/525 |

* cited by examiner

*Primary Examiner* — Daniel D Chang
(74) *Attorney, Agent, or Firm* — Tarolli, Sundheim, Covell & Tummino LLP

(57) ABSTRACT

A locking system for an integrated circuit (IC) chip can include an arrangement of one or more antifuse devices in a signal path of the IC chip. The antifuse devices can be configured to operate in a first state, corresponding to a normally open switch, to inhibit normal operation of the IC chip, and to transition from the first state to a permanent second state, corresponding to a closed switch, in response to a program signal applied to at least one terminal of the IC chip to enable the normal operation of the IC chip.

20 Claims, 7 Drawing Sheets

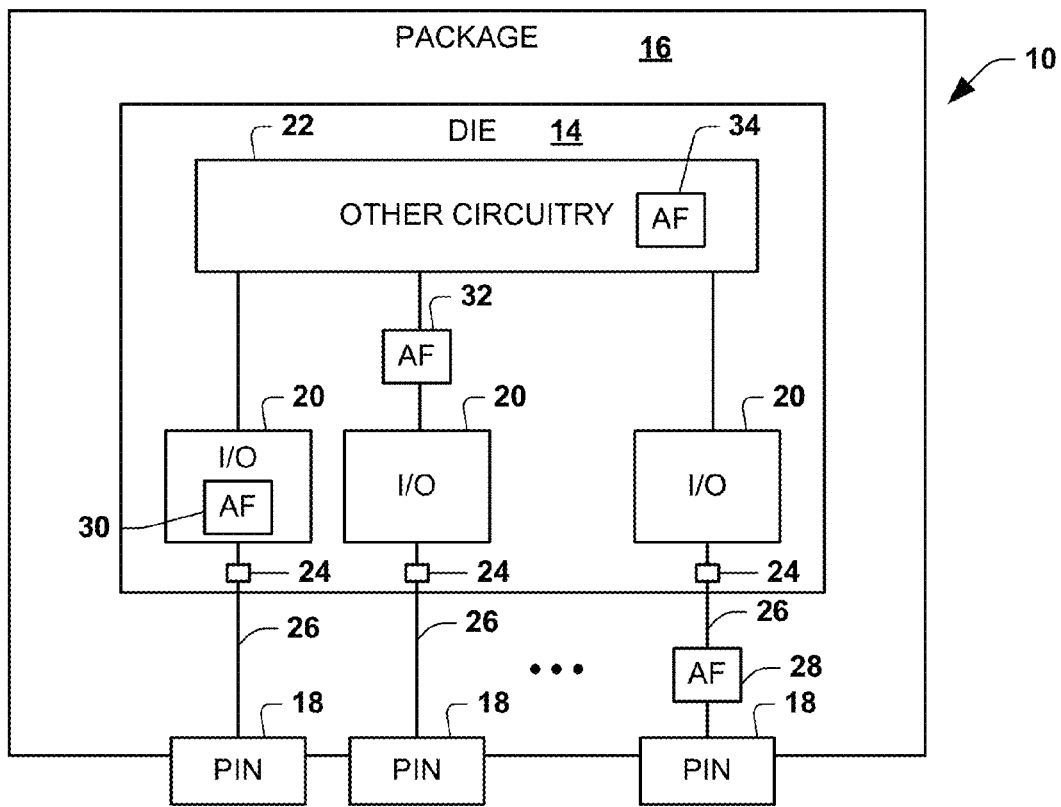
FIG. 1
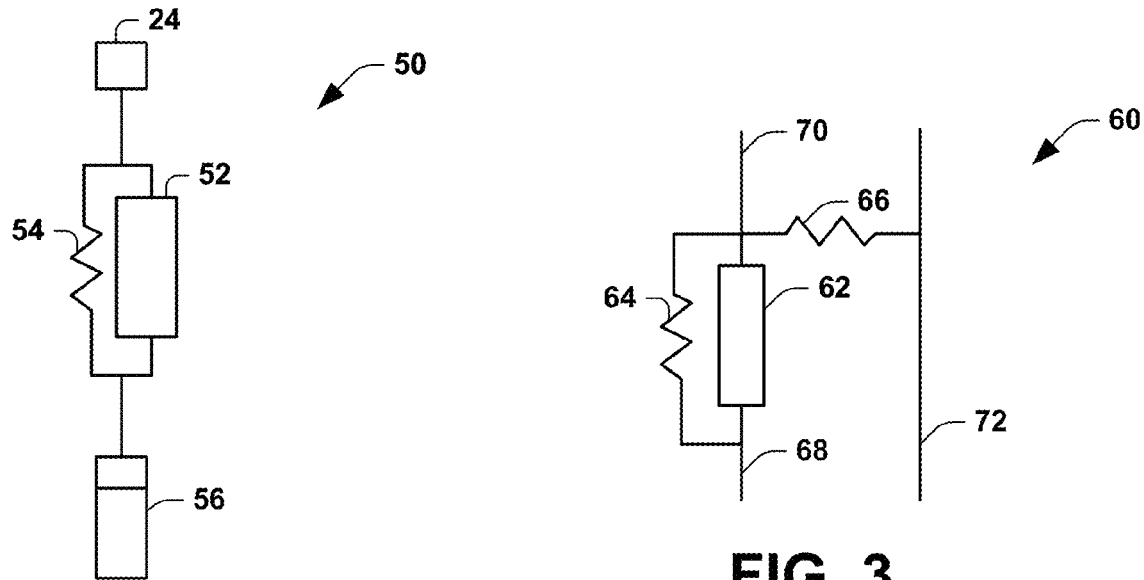
FIG. 2
FIG. 3

DEFENSE AGAINST COUNTERFEITING USING ANTIFUSES

CROSS-REFERENCE AND INCORPORATION OF RELATED APPLICATION

This application claims the benefit of U.S. Provisional Patent Application No. 61/904,255 filed 14 Nov. 2013 and entitled DEFENSE AGAINST COUNTERFEITING ATTACKS USING ANTIFUSES, which is incorporated in its entirety herein by reference.

TECHNICAL FIELD

This disclosure relates generally to integrated circuit chips and to methods of protecting integrated circuits against counterfeiting.

BACKGROUND

A counterfeit Integrated Circuit (IC) is an electronic component with discrepancy on the material, performance or characteristics, but sold as a legitimate chip. It can be an unauthorized copy, remarked/recycled die (e.g., used chip sold as new), cloned design at untrusted foundry, or a misrepresented, failed real part. Counterfeit ICs can have altered functionality, poor performance or degraded reliability of operation. The significant rise in counterfeit ICs is a major concern to chip designers, system integrators as well as end users in the semiconductor industry. The cost of counterfeiting and piracy is estimated to rise to 1.2 to 1.7 trillion dollars by 2015.

The increasingly complex global semiconductor supply chain, spanning different countries and their legal systems to meet the ever-rising demand, provides ample opportunities for adversaries to insert counterfeit chips in the market. Prior to actual deployment, an IC is often bought and resold many times. Purchasers rely on brokers, who in turn may buy from untrustworthy entities including online forums. Various sneak channels are offered by the current semiconductor business model that can be exploited by an adversary. The two major categories of counterfeit ICs include: 1) remarked/recycled and 2) cloned new parts. The former includes the selling of aged chips as new in the open market, after possibly repackaging and relabeling of the die. Cloned chips involve unauthorized production of an IC without legal rights. It is typically performed through reverse engineering an IC or IP piracy at different levels.

The standard chip tests are often inadequate in detecting various forms of counterfeit ICs. Additionally, the existing design-for-counterfeit prevention approaches are often not attractive due to inadequate coverage of counterfeit chips and/or significant design/test effort as well as hardware overhead.

SUMMARY

This disclosure relates generally to integrated circuit chips and to methods of protecting integrated circuits against counterfeiting by using antifuse (AF) devices.

As one example, a locking system for an integrated circuit (IC) chip can include an arrangement of one or more antifuse devices in a signal path of the IC chip. The antifuse devices can be configured to operate in a first state, corresponding to a normally open switch, to inhibit normal operation of the IC chip, and to transition from the first state to a permanent second state, corresponding to a closed switch, in response to a program signal applied to at least one terminal of the IC chip to enable the normal operation of the IC chip.

As another example, an integrated circuit (IC) chip apparatus can include a die that includes die pads and circuitry designed to propagate electrical signals. A package encases the die and includes a plurality of connection terminals to provide for at least one of input or output of electrical signals with respect to the IC chip. At least one antifuse can be configured as an anti-counterfeiting mechanism to operate in a first state, corresponding to a normally open switch, to inhibit normal operation of the IC chip. Each antifuse device can transition from the first state to a permanent second state, corresponding to a closed switch, in response to a program signal applied to at least one of the plurality of connection terminals of the package to enable the normal operation of the IC chip.

BRIEF DESCRIPTION OF THE DRAWINGS

FIG. 1 depicts an example of an IC chip using one or more antifuses.

FIG. 2 depicts an example of an antifuse device.

FIG. 3 depicts an example of another antifuse device.

DETAILED DESCRIPTION

Figure 4:
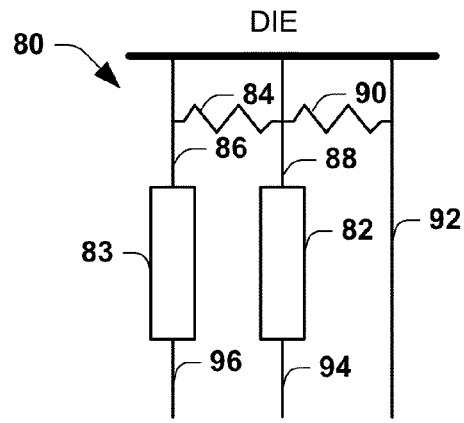
FIG. 4 depicts an example of a locking mechanism for an IC chip that includes multiple antifuses.

This disclosure relates to an anti-counterfeiting approach based on locking using antifuse (AF) devices. The locking AF devices can be implemented on the die and/or in packaging of an IC chip to provide active defense against various forms of counterfeiting attacks, which can include providing a locking and/or authentication mechanism for an IC chip. This disclosure provides an antifuse-based chip locking scheme that can effectively protect against counterfeit chips, including reselling/remarking as well as design piracy and reverse-engineering attacks. The approach disclosed herein can be implemented by placing one or more AF devices in input/output port circuitry, in packaging or a combination of on-die and packaging level antifuses. To enable pre-deployment testing of IC chips that implement antifuse locking units, test e-Fuses (FUs) can be inserted in parallel with antifuses.

Additionally or alternatively, protection against cloning attacks can be achieved through an AF-based authentication process. For example, the authentication process can generate a physically unclonable signature such as by the manufacturer or other trusted party before deployment and use of the IC chip. The resulting signature can be verified when a chip is used by ensuring that its signature matches a signature that was generated for the IC chip. Each signature will be unique to each respective IC chip as it exploits intrinsic variations in program resistance of AFs due to inherent manufacturing and programming effects. Since the chip-level security afforded by the approach disclosed herein incurs virtually zero design effort, the approach can be implemented with minimal area overhead as well as lower cost. The unified security scheme is robust against temperature variations and allowable degree of measurement noise during signature creation/verification. Using AFs in an IC as an anti-counterfeiting mechanism is flexible to various design constraints and scalable to different classes of chips (analog/digital) with varying number of pins.

FIG. 1 depicts an example of an integrated circuit chip 10 that can implement one or more antifuses 28, 30, 32 and/or 34 as a chip locking mechanism. Thus, the IC chip 10 implementing the one or more antifuses 28, 30, 32 and/or 34 can protect against counterfeit use of the chip, which can include recycling of the chip and/or cloning. An AF device can be added to either inside the GPIO (general purpose input output) logic or in between GPIO and the "other circuitry" i.e. the core logic depending on the designer's choice, as shown in 30 and 32. An AF based lock can also be added inside a die, as shown in 34, to lock some component of a die. For example, one can add a lock to the crypto module on a chip by using a separate AF device. This can be done in addition to the locks on the pin to provide higher level of defense to specific critical modules.

The IC chip 10 includes a die 14 that is mounted within a package 16 and includes a plurality of pins 18 that connect with circuit paths of the die. The general construction of the IC chip 10 can be similar to any IC chip including one or more die mounted within a package material 16 and including pins 18. As an example, the die can include input/output circuitry 20 that connects the pins to other circuitry 22 implemented on the die 14. The input/output circuitry 20, for example, can be implemented as a general purpose input/output circuitry for driving signals to and/or from the other circuitry via the pins 18. The other circuitry can depend on the particular application for which the chip has been implemented. Examples of such other circuitry 22 can include field programmable gate arrays, controllers, logic circuitry, memory circuitry, application specific integrated circuitry and the like. The die 14 also includes pads 24 that are utilized to connect the pins 18 in the packaging through corresponding interconnects demonstrated at 26. For example, the interconnects 26 can be implemented as wire bonding that electrically and physically connects (e.g., via soldering) the pads 24 to respective pins 18 implemented in the package 16.

As disclosed herein, one or more antifuses 28, 30, 32 and 34 can be implemented at various places of the IC chip 10 to implement a locking and/or authentication mechanism for the IC chip 10. By way of example, one or more antifuses 28 can be connected between pins and the IO circuitry such as connected between the pads and pins through corresponding connections. As another example, one or more antifuses 30 can be implemented in one or more of the IO circuits 20. As yet another example, one or more antifuses 32 can be connected between the IO circuit 20 and the other circuitry 22 implemented on the die. As yet a further example, one or more antifuses 34 can be implemented within the other circuitry 22. The particular location in which the antifuses are implemented and the number of antifuses can vary according to application requirements and the desired level of security to be implemented.

Figure 6:
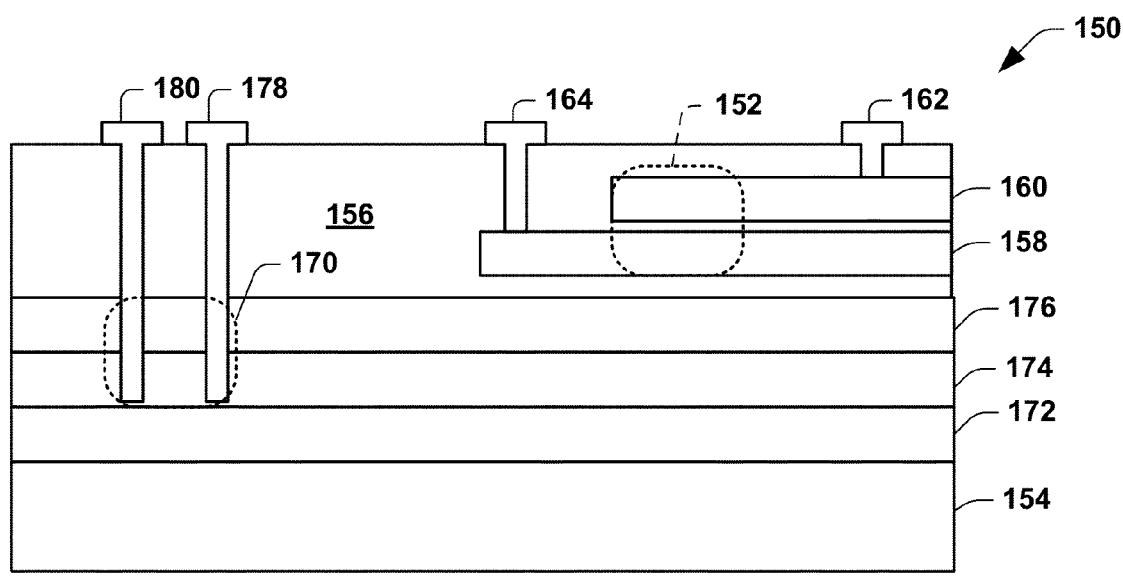
FIG. 6 depicts an example of an on-die antifuse-fuse locking unit implemented in an IC chip.

As disclosed herein, each antifuse 28, 30, 32, 34 is a one-time programmable (OTP) device, which exhibits electrical properties of a normally-open switch in the locked condition having a high resistance condition (e.g., as resistance >100 MΩ). In the unlocked condition, after programming, the antifuse exhibits electrical properties of a closed switch having a low resistance condition (e.g., a resistance ranging from about 2052 to about 1 KΩ). One example of an AF IC structure is a Metal-Insulator-Metal (MIM) structure, such as shown in FIGS. 6 and 7. A MIM structure exhibits low on-state resistance and capacitance, and has lower breakdown voltages. Electrical and programming parameters for an example MIM AF structure are provided in Table I.

TABLE 1

| Parameters | Approximate Value |
| --- | --- |
| Programming Voltage | 4-6 V |
| Programming current | 5-15 mA |
| Programming duration | 0.1-5 ms |
| OFF state resistance | 50 MΩ-1 GΩ |
| ON state resistance | 10Ω-80Ω |

Other possible AF structures include nanoelectromechanical (NEMS) AF structures, such as disclosed in U.S. Patent application No. 14/542,343, entitled NANOELECTROMECHANICAL ANTIFUSE AND RELATED SYSTEMS, which is being filed contemporaneously to this application and is incorporated herein by reference. As an example, the AFs can be implemented as silicon carbide NEMS antifuse devices. The NEMS antifuse devices include a cantilever or other moveable structure that can be activated from a rest or inactive state (e.g., locked mode) in which the device provides an open circuit to one or more permanent states (e.g., unlocked mode) in which the device provides a short circuit path through the NEMS device. For instance, a NEMS AF device can include a two-terminal device having two states as well as a three-terminal device having more than two (e.g., three or more) possible states—two of which are permanent states. The NEMS antifuse devices can provide improved performance relative to other types of AFs and, in many cases, can be scaled down to smaller sizes than other antifuse devices. While MIM and NEMS AFs provide an effective AF device, the AFs disclosed herein can employ one or combination of these (MIM and/or NEMS) and other types of AF devices as locking mechanisms, such as dielectric antifuses, amorphous silicon antifuses and Zener antifuses.

As disclosed herein, each of the antifuses 28, 30, 32 and 34 implemented in the IC chip 10 can be originally in the locked (e.g., high resistance) condition such that it provides a high resistance. The condition of the antifuse 28, 30, 32 and 34 can be detected by measuring the impedance across the AF device. Thus, the low resistance of AFs can be measured to detect that the IC chip 10 has been unlocked and thereby is a used device. In contrast, measuring that the AFs have high resistance can be used to ensure that the IC chip 10 is unused. As disclosed herein, the resistance measurements across a plurality of AF devices can also be used to generate a unique signature for the IC chip 10 which can be compared to stored signatures, derived from previously acquired resistance measurements to verify that the IC chip is authentic.

FIG. 2 depicts an example of an antifuse locking unit 50 that includes an antifuse 52 connected in parallel with a fuse 54. The antifuse 52 and fuse 54 thus provide an antifuse-fuse (AF-FU) pair. The fuse 54 is a one-time programmable device that behaves as a normally closed switch (e.g., a short circuit or low resistance path) until it is activated in response to a test program voltage in which the fuse 54 operates as an open switch having a high resistance such as greater than about 100 MΩ. In the example of FIG. 2, the lock unit (including the AF-FU pair) 50 is connected between a pin 56 and a pad 24 such as corresponding to the antifuse 28 shown in FIG. 1. The antifuse locking unit 50 (AF-FU pair) can be implemented at any location demonstrated by any of the AF devices 28, 30, 32 and/or 34 in FIG. 1.

As disclosed herein, a combination of antifuse devices connected to particular locations in a given IC chip (e.g., chip 10 of FIG. 1) can require predetermined voltages supplied to antifuses and/or test fuses in a particular order to unlock the given chip to provide complete access to its functionality. The electrical parameters to activate the fuse can be designed to exceed the parameters to program its associated AF device to mitigate unintentional activation of the respective devices. Examples of electrical parameters for programming an FU are provided in Table 2.

TABLE 2

| Parameters | Approximate Value |
| --- | --- |
| Programming Voltage | 4-10 V |
| Programming current | 10-30 mA |
| Programming duration | 0.1-.5 ms |
| OFF state resistance | 5 MΩ-100 MΩ |
| ON states resistance | 10Ω-200Ω |

The package level integration of antifuses for locking the IC chip further can lead to an uninterrupted IC design cycle and virtually no designed overhead. That is, the design and manufacture of the die 14 can occur according to the normal design process without consideration of antifuses, such as antifuse 28 in FIG. 1, since the addition of the one or more antifuse 28 in the package substrate layers are separate from the design and manufacture of the IC die 14.

Programming of AF-FU devices can be facilitated with different configurations of AF and FU devices, as shown in FIG. 3 and FIG. 4. Also the security level can be enhanced by adding multiple levels of AF devices in series. One such possible configuration is shown in FIG. 5.

FIG. 3 depicts another example of an antifuse locking unit 60. The antifuse locking unit 60 includes an antifuse 62, a test fuse 64 and a programming fuse 66. The antifuse locking unit 60 can be implemented as any of the AF devices 28, 30, 32 and/or 34 in FIG. 1. Similar to FIG. 2, the antifuse 62 is connected in parallel with the test fuse 64. The test fuse 64 can be utilized to test the IC chip (e.g., by or on behalf of the manufacturer) before deployment. Thus, prior to its activation to an open circuit condition, the test fuse 64 provides a short circuit path between terminal ends 68 and 70. This can be achieved by designing the program current of inter pin programming fuse to be higher than that of the test fuse 64. After activation of the antifuse and fuse, the terminals 68 and 70 are connected through a substantially short circuit via the antifuse 62 while the test fuse 64 operates as an open circuit.

The programming fuse 66 can be implemented as a fuse device operating as a normally closed switch (e.g., a short circuit or resistance less than about 200 ohm) similar to the test fuse, as disclosed herein. In some examples, the programming fuse 66 is connected between one or more antifuse device and a pin to which no antifuse structure is directly connected. The programming fuse 66 can be used to facilitate programming the antifuse device 62. For example, a programming voltage can be applied across the terminals 68 and 72 to supply current for a duration sufficient to rupture the antifuse 62 such that it becomes programmed to provide a substantially short circuit between terminals 68 and 70. Following the rupture of the antifuse 62, the programming fuse 66 can be blown to provide a corresponding short circuit between terminals 70 and 72. This process can be repeated for a plurality of pins of an IC chip to unlock the IC chip (e.g., IC chip 10 of FIG. 1).

Figure 5:
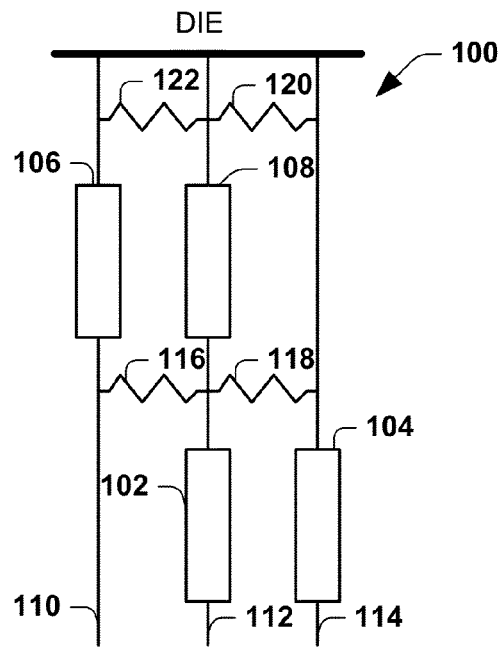
FIG. 5 depicts an example of another locking mechanism that can be utilized for an IC chip employing multiple levels of antifuses.

As a further example, FIGS. 4 and 5 depict examples of different AF-based locking mechanisms that can be implemented in the packaging layer of an IC chip. In these examples, each antifuse can include a test fuse (not shown), which may have already been activated prior to deployment. The examples of FIGS. 4 and 5 demonstrate how AF-FU pairs can cooperate to provide a locking mechanism that can be activated to unlock and enable functionality of a corresponding IC chip. More particular FIGS. 4 and 5 demonstrate how the AF-FU pairs can be connected in a specific arrangement, which requires programming them a proper application of prescribed programming signals. The robustness of the arrangement of AF locking units can be enhanced by including multiple levels AF-FU pairs in series for each pin, such as demonstrated in FIG. 5. Thus, the proposed locking can effectively prevent against different forms of recycling and remarking attacks.

FIG. 4 depicts an example of a type of single level AF network 80 of antifuse devices (e.g., each corresponding locking unit 50 of FIG. 2) 82. A program fuse 84 is connected between adjacent terminals 86 and 88 of respective antifuse devices. Another program fuse 90 is connected between terminal 88 and another input terminal 92 (e.g., corresponding to another input pin of the IC chip). In this example, the combination of terminal 92, program fuse 90 and antifuse 82 provides a program path to rupture and thereby unlock the antifuse 82. For instance, in response to supplying a program voltage (from a program device—see, e.g., FIG. 12) across terminals 92 and 94, a corresponding amount of current passes through the antifuse device 82 for a program period of time. As a result, the resistance of antifuse can change from its normally open circuit condition of about 10 MΩ or greater to a substantially short circuit condition of less than about 100Ω. After the antifuse 82 has been unlocked, the program fuse 90 can be programmed to change from its normal substantially short circuit ON condition to an open circuit OFF condition by supplying an e-fuse program voltage to the same terminals 92 and 94 but at different electrical levels sufficient to activate the program fuse 90.

The next antifuse 83 can be programmed from its OFF condition to its ON (unlocked) condition in a similar manner. For example, a prescribed program voltage can be applied to the terminals 94 and 96 to provide a sufficient amount of current through the antifuse 83 for a program period of time via the unlocked antifuse 82, program fuse 84 and the antifuse 83. Additionally, after the antifuse 83 has been programmed to its substantially short circuit ON condition, the program fuse 84 can be programmed to its substantially open circuit OFF condition by supplying at least a minimum voltage for a sufficient period of time to blow the fuse 84. As a result, each of the terminals 94 and 96 are electrically connected (e.g., short circuit paths) with the terminals 88 and 86, respectively, to enable signals to propagate between the inputs (e.g., pins) 96 and 94 and circuitry on the die. In view of the simplified example of FIG. 4 demonstrating two antifuses 83 and 82, it can be understood how an arrangement of antifuse devices and program fuses can be implemented in the packaging layer between a plurality of pins and die pads (or at other locations) to provide a chip locking and unlocking function for an IC chip.

FIG. 5 depicts an example of another chip locking mechanism 100 that includes a plurality of antifuses 102, 104, 106 and 108. In this example, the antifuses 102, 104, 106 and 108 are implemented at multiple levels between inputs 110, 112 and 114 and an associated die. Corresponding fuses (e.g., e-fuses) 116, 118, 120 and 122 are connected with respective antifuses (e.g., as antifuse-fuse pairs) to enable programming/unlocking of the antifuses 102, 104, 106 and 108 in a prescribed order by application of programming voltages to the input terminals (e.g., corresponding to pins) similar to as described with respect to the example of FIG. 4. Although, the use of multi-level inter-pin AF-FU pairs increases the fabrication complexity, it significantly complicates the reverse engineering process from the attacker's perspective.

As mentioned, certain examples of the chip locking mechanisms disclosed herein can be implemented at the package layer without any modifications being required to the die. FIG. 6 demonstrates an example of part of a multi-layer structure 150 that includes an antifuse 152, such as can be implemented on die (e.g., in I/O circuitry). Bonding wires can be utilized to electrically connect between terminals of the antifuse and the respective pins and die pads. The example of FIG. 6 depicts a metal-insulator-metal (MIM) antifuse structure 150 that can be implemented in I/O circuitry in the electrical path between a pin and associated die pad. As mentioned, other types of antifuses can also be utilized, such as including a nanoelectromechanical antifuse structure. Additionally, while the example of FIG. 6 is demonstrated with respect to IC chips having a plurality of pins, this concept further can be extended to ball grid array or other types of packages.

By way of example, the structure 150 can include a substrate layer 154 such as can be a silicon (Si) or other semiconductor substrate. The layers of the antifuse 150 can be deposited over the silicon substrate layer 154 such as being fabricated within a nitride layer (e.g., plasma nitride) 156 or other insulating material layer. In the example of FIG. 6, the antifuse layers include a tungsten layer 158 that is formed below the nitride layer, and then a corresponding aluminum layer 160 is deposited above and overlying the tungsten layer 158 within the nitride insulator.

The antifuse 152 can be formed as an overlying region between the tungsten and aluminum layers 158 and 160, respectively, separated by a layer of plasma nitride interposed in between such layers. Metal contacts 162 and 164 can be formed to provide an electrical connection to provide the program voltage to respective ends of the antifuse 152. The corresponding metal contacts 162 and 164 thus provide corresponding terminals of the antifuse 152 (e.g., corresponding to terminals 86 and 96 of antifuse 83) to which the program voltage can be applied for unlocking the antifuse from its normally open circuit condition to its closed switch condition. The metal contacts 162 and 164 can be formed by implementing plasma and deep reactive-ion etching (DRIE), for example.

As disclosed herein, in some examples, an antifuse can be implemented in conjunction with an e-fuse to provide an AF-FU pair. FIG. 6 demonstrates an example of an AF-FU integrated in a common multi-layer structure 150. Thus, in this example, the structure 150 includes the antifuse 152 and an e-fuse 170. For example, the layers of the e-fuse 170 can be deposited over the silicon substrate 154 prior to formation of the antifuse structure 152. As demonstrated in the example of FIG. 6, a silicon dioxide ($SiO_2$) layer 172 can be deposited over the substrate 154 and a corresponding polysilicon (poly Si) layer 174 can be deposited. A corresponding silicide layer 176 can be deposited over the polysilicon layer 174, such that the silicide and poly Si layers can form the e-fuse 170. For example, metal contacts 178 and 180 can be formed (e.g., via etching and metal deposition) through a nitride layers and the corresponding silicide and poly Si layers to form the antifuse. The e-fuse 170 provides a normally closed switch condition (e.g., low resistance, such as less than about 100Ω) until activated to its OFF condition by a corresponding program current, where it can change state to a normally open circuit condition (e.g., high resistance, such a greater than about 100 MΩ).

Figure 7A:
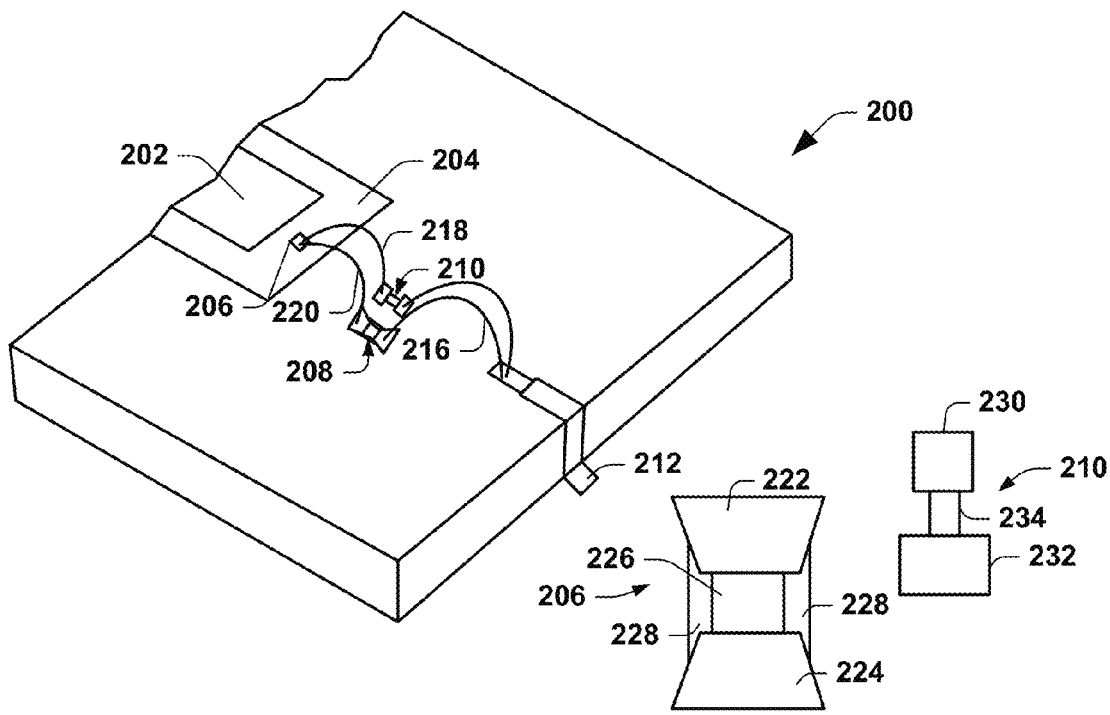
FIG. 7A depicts an example of an antifuse-fuse locking unit implemented in packaging of an IC chip.
Figure 7B:
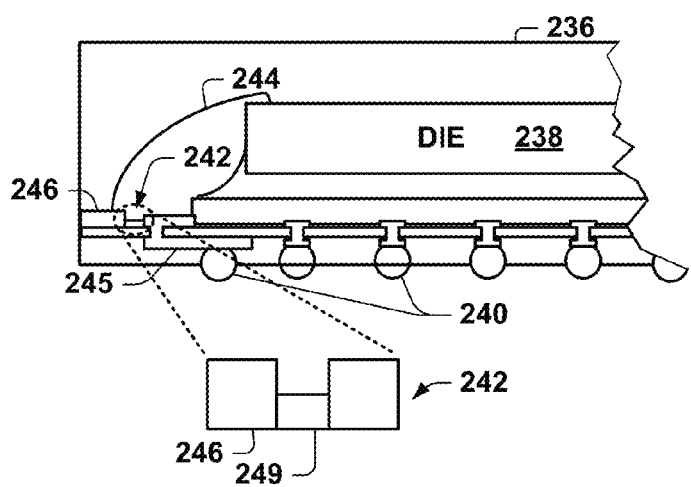
FIG. 7B depicts another example of an antifuse-fuse locking unit implemented in packaging of an IC chip.

As disclosed herein above, the AF locking unit (e.g., AF only or AF-TF pair) can also be implemented in the packaging of the IC chip. The configuration of the AF locking unit may be adapted to extend to all packaging types, such as including current state of the art Ball Grid Array (BGA) based chip scale packages (CSP). The pin level AF-TF structures would be implemented at the package level, leaving the die untouched. The implementation concept can be extended to all packaging types including current state of the art Ball Grid Array (BGA) based chip scale packages (CSP). Based on the type of chip mount (on for example a PCB), density of pins and package size/dimensions, IC packages are mostly categorized into 3 main types: 1) Through Hole; 2) Surface Mount and 3) Chip Scale Packages. AF-TF structures at the candidate pins thus can be integrated between the corresponding die pads and pins. For instance, based on the package size with respect to the bare die estate and the type of existing connections between die pad and external pins, these units (AF-TF) would be implemented in discrete form on packaging substrate or grown on it selectively. FIGS. 7A and 7B demonstrate but two examples of AF locking units that can be implemented at the package level.

FIG. 7A depicts an example of part of an IC chip 200 that can implement one or more AF locking units as disclosed herein. It includes on-die core circuitry 202 as well as corresponding on die I/O circuitry 204, such along a perimeter portion of the die. The I/O circuitry 204 is accessible via die pads 206. The AF locking unit in the example of FIG. 7A includes an antifuse 208 and a fuse 210 (e.g., defining an AF-FU pair). The locking unit is connected in the circuit path between a metal pin 212 of the chip and a die pad 206.

For example, the wire bond 214 connects the pin 212 to the cathode 232 of the fuse 210. Another wire bond 216 also connects to pin 212 to a metal electrode 224 of the antifuse 208. Additional wires 218 and 220 connect the fuse 210 and antifuse 210 with the die pad 206. As demonstrated in the enlarged view of the AF-FU pair, the antifuse thus includes a pair of metal electrodes 222 and 224 spaced apart from each other by an insulating material 226. Passivation layer 228 can surround the insulating material 226 also between electrodes 22 and 224 to provide a corresponding metal-insulator-metal antifuse such as disclosed herein. The fuse 210 can include an anode 230 spaced apart from its catheter 232 by a semiconductor, such as a silicide link, as disclosed herein. The chip can include any number of antifuses and AF-FU pairs.

FIG. 7B depicts another example of part of an integrated circuit 236 that can implement one or more of AF-based locking units demonstrated at 242. The example of FIG. 7B corresponds to a package level antifuse in the context of the wire bonded BGA based chip scale package. It is understood that similar AF-based locking unites could be implemented in other package formats, such as including a flip-chip bonded BGA based chip scale packages or other formats. The IC 236 includes a die 238 mounted to a BGA package that provides solder bumps 240 as part of the package for mounting the IC 236. The antifuse 242 is connected by an electrically conductive trace 245 to a given solder bump. Another conductive trace 246, which is separated from trace 245 by the antifuse 242, is connected to a die pad via a bond wire 244. Thus, in the open circuit condition, the associated solder bump 240 remains electrically isolated from the die pad to which the wire bond 244 connects. Upon programming of the antifuse 242, in response to a program voltage, the conductive traces at opposite ends of the antifuse are shorted together thereby connecting the solder bump to the die pad through the electrical path that includes traces 245 and 246 as well as bond wire 244. As demonstrated in the enlarged view of the MIM antifuse 242, the antifuse includes metal layers 248 separated by the insulator material 249, such as disclosed herein.

Figure 8:
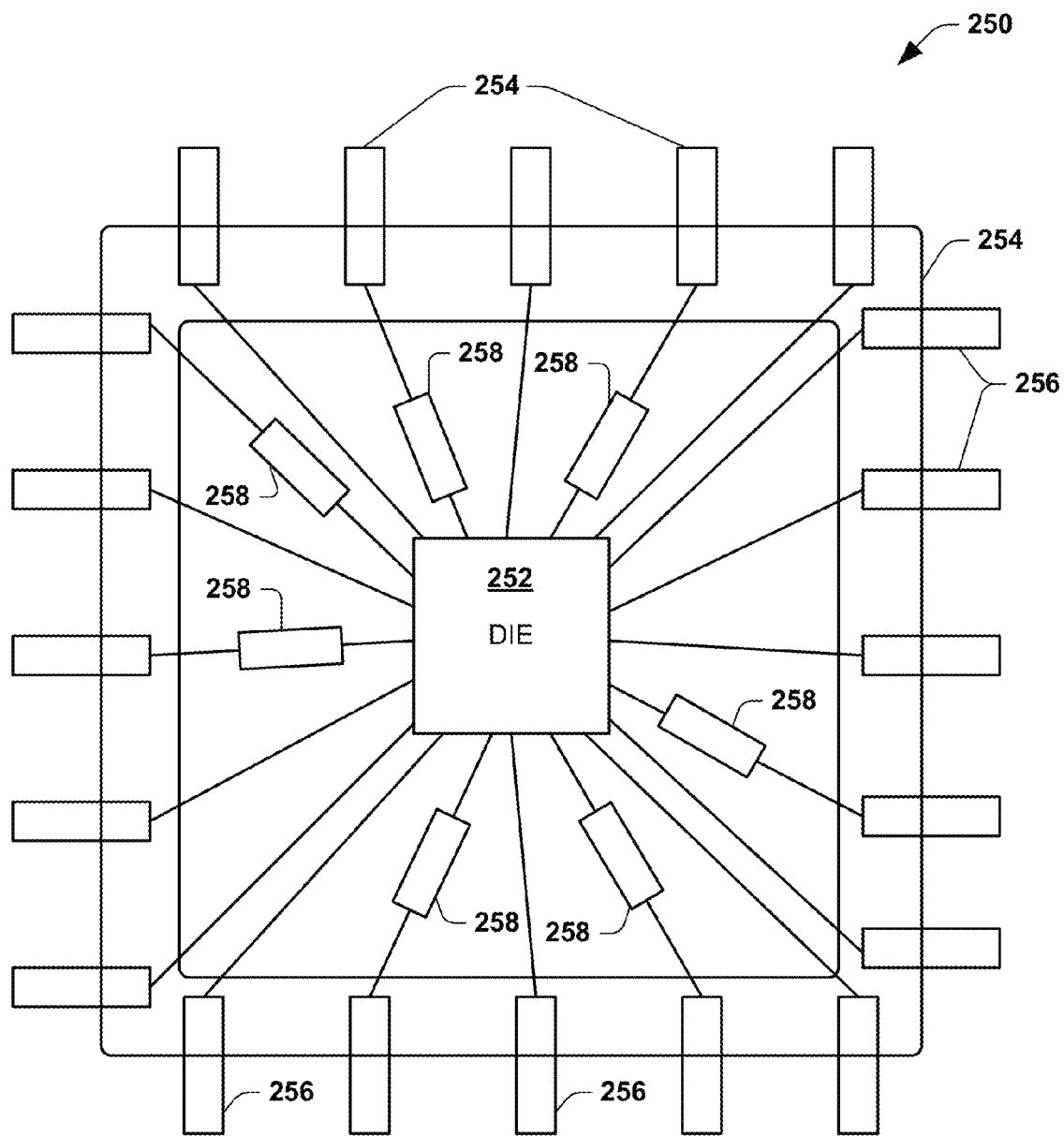
FIG. 8 depicts an example of an IC chip including an arrangement of antifuses between the die and pins.

As a further example, FIG. 8 demonstrates a schematic example of an IC chip 250 implementing an AF-based locking unit in the packaging layer of the chip. The IC chip 250 includes a die 252 mounted with an IC packaging 254. In the example of FIG. 8, the IC chip 250 includes a plurality of pins 256 disposed along a perimeter of the package such as can correspond to a pin grid array or other type of package. Other types of package configuration could also implement the AF-based locking mechanisms disclosed herein. In the example of FIG. 8, one or more antifuses 258 are connected between die pads of the die and corresponding pins 256. For example, each of the AF lock units 258 can be implemented as an AF-FU pair as disclosed herein. Test fuses would be coupled in parallel with the antifuse for a final chip testing and be blown before deployment and shipment of the IC chip 250.

Figure 9:
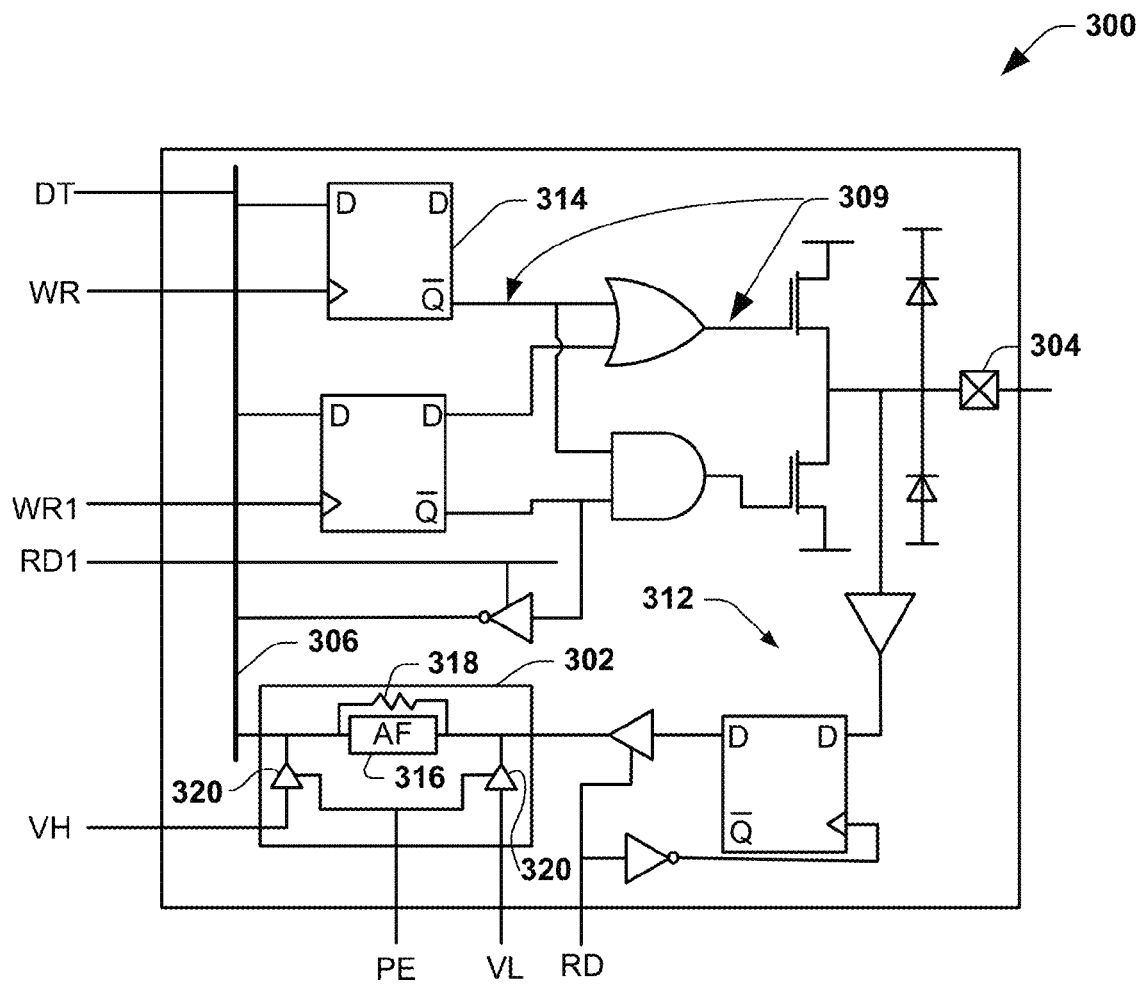
FIG. 9 depicts an example of an input/output circuit including an antifuse locking mechanism.

In addition or as an alternative to implementing one or more antifuses in the packaging layers between pins and die pads, one or more antifuses may also be implemented within the general purpose input/output circuitry of the IC chip between the die pad and other circuitry thereof. FIG. 9 depicts an example of I/O circuitry 300 incorporating an AF-based lock unit 302. The particular circuitry demonstrated in the example of FIG. 9 corresponds to I/O circuitry (e.g., a general purpose I/O port) similar to what can be found in IC chips for a microcontroller, processor or FPGA. It is appreciated that the particular I/O circuitry can vary from IC chip to IC chip. The AF lock unit 302 is inserted in the I/O circuitry 300 between the pad 304 and a corresponding data line 306. In the example of FIG. 9, the AF lock unit 302 is inserted along an input path of the I/O circuitry 300. In other examples, an antifuse could be inserted at different locations along the output path, such as demonstrated at 309. When the I/O circuitry 300 operates as an input, the output driver 310 is in the high impedance state and the data bit is read through the input latch and buffer, demonstrated at 312. In the output mode, the data in the latch 314 is transferred to the pad 304 via logic that controls the driver 310.

In this example, the lock unit 302 includes an antifuse 316 and a test fuse (e.g., an e-fuse) 318 coupled in parallel across the antifuse. AF program signals are routed to the IO port circuit 300, which include the program high (PH) and low (PL) voltages to the AF and the program enable (PE) to buffers 320. The buffers 320 enable the program circuitry (not shown—see, e.g., FIG. 11) to unlock the antifuse 316 and/or to blow the test fuse 318, such as disclosed herein.

As a further example, the test fuse 318 provides a test path, including an e-fuse like test fuse 318, can be placed in parallel to each antifuse in the IC chip, such as for use during chip testing. After testing and validation of the IC chip, each test path would be disabled by blowing the e-fuse, such as disclosed herein. Hence, an adversary cannot utilize test paths for causing malfunction or functional reverse-engineering. After the one-time programming of the locked antifuse (e.g., by key input) 316, the AF program buffers 320 remain in the high impedance state, and hence no interference occurs in the normal input-output operational modes. The antifuse 316 can be placed in the I/O circuitry 300 after the buffer and not directly near the pad 304 to mitigate potential alterations of AF state due to environmental interference (voltage, EMI, stray signals etc.) through the pads.

Figure 10:
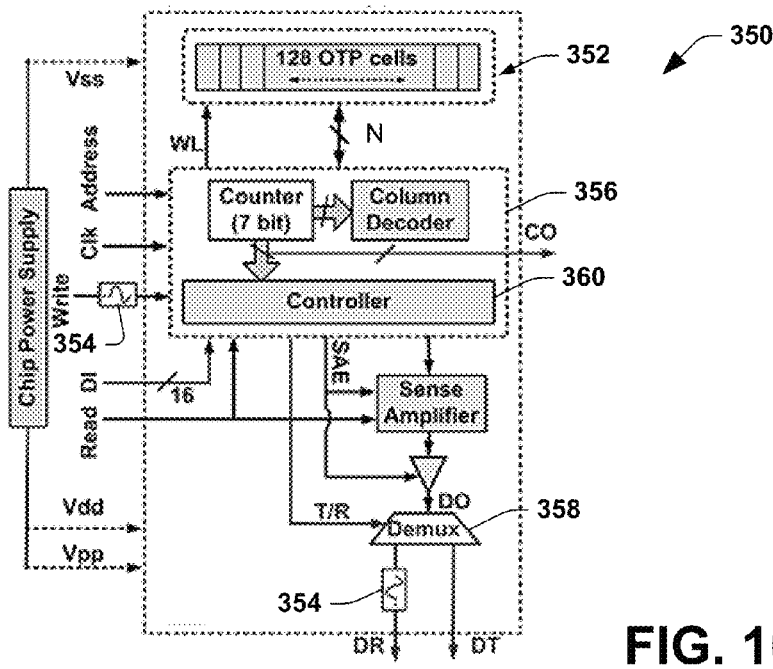
FIG. 10 depicts an example of a structure for programming an authentication key for AF locking mechanism.

FIG. 10 demonstrates an example structure 350 that can implement an AF based memory array for programming an authentication key in a corresponding memory 352 (e.g., non-volatile memory). For example, the memory 352 can be implemented as One Time Programmable (OTP) Read Only Memories (ROM), such as based on Metal Oxide Semiconductor (MOS) gate capacitor Antifuses (AF), can be utilized due to no extra process steps and higher reliability at advanced process nodes, compared to flash and PROM structures. To mitigate access to the memory after key programming 352, an input write line for writing to the memory 352 and/or an output line for reading the key can include one or more OTP fuses 354, such as e-fuses disclosed herein. While the example memory 352 is demonstrated as a 128 bit memory to store the input program key, other numbers of fewer or greater bits can be used to store the input key. As an example, one or more key bit operations per cycle can be selected for programming and comparison, with a lower number minimizing hardware overhead. Internal control logic 356 maintains the transitions between different states. For key programming, the write signal is enabled. The address bits of the column decoder are controlled by a counter implemented in the control logic 356. Various mechanisms can be utilized to help prevent external key read out in field by an adversary.

After programming, based on an enabled test signal (T/R) to a de-multiplexer 358 by the controller 360, the key bits are read out once through the external read line (DR) for validation. Consequently, DR is disabled by programming the OTP e-fuse. During IC authentication, T/R signal is disabled by the controller, passing the individual key bit values through DT to the lock/unlock circuitry for comparison. DT does not have any external access. To reduce the possibility of field programming of the unprogrammed AFs (cells storing 0), the write signal can be disabled by a similar protection scheme. When the legitimate IC, which has been locked via programming one or more antifuses, reaches a system designer or other authorized user, he/she uses the proprietary device (obtained from manufacturer either directly or a trusted supply chain) to input the key and unlock the AFs in pin. All NVM signal lines can be derived from multiplexed original ports to avoid addition of chip ports.

Figure 11:
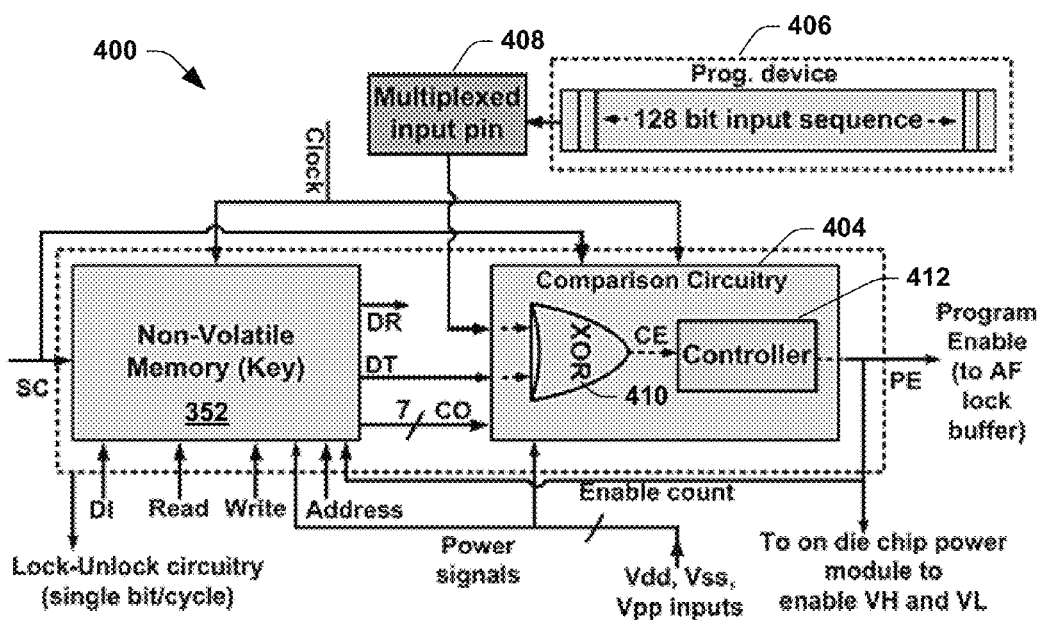
FIG. 11 depicts an example of a programming circuit that can be utilized to program an AF-based locking mechanism.

FIG. 11 depicts an example of a system 400 that can be utilized to provide an input sequence (e.g., an authentication key) for unlocking an IC chip implementing one or more antifuses (e.g., antifuse 302 of FIG. 9). The system 400 includes a non-volatile memory 352 that stores a programmed authentication key therein. The non-volatile memory can correspond to the memory 352 of FIG. 10. The output of the memory is provided to a comparison circuitry 404. The comparison circuitry 404 is configured to compare the authentication key from memory 352 with a corresponding input sequence that is provided via a programming device 406. The programming input sequence from the device 406 can be provided to the IC chip via multiplexed input pin 408 to another input of the comparison circuitry 404. The program device 406 can be a proprietary device that is configured to upload the input sequence to the one or more multiplexed input pins according to the design requirements. The input sequence and the readout from the non-volatile memory 352 can thus be compared relative to each other by the comparison circuitry 404. As an example, the comparison circuitry 404 can include combination logic comprising one or more exclusive OR gates 410 that provide a corresponding enabled output to a controller 412 that provides the program enable (PE) output. To help prevent input data dependent power consumption patterns, the XOR gate 410 and the controller 412 can be implemented in a power balanced logic style.

The controller 412 thus can transition its PE output between locked and unlocked states according to the results of the comparison performed by the XOR gates. For example, the program enable output corresponds to the PE input signal provided to the antifuse 304 shown and disclosed with respect to FIG. 9. Additionally, the output of the controller 412 can be provided to enable the VH and VL inputs that are also provided to program the input pin. The AF cell programming voltages (e.g., Vpp ~5V) in the memory and lock units can be derived directly from the primary supply input. Related clock inputs can be derived from the on-chip PLLs, for example.

Additionally, to help prevent any input sequence dependent timing, current and hence power signatures, in all input scenarios, the controller 412 can compare the entire length of the key and sequence, to transition to either the Program or Idle state. A separate signal mismatch would be enabled on the first bit inequality. On comparison of all bits, if the mismatch is low, pin unlocking is enabled. Otherwise, the idle state is restored and the locking is disabled.

Moreover, instead of a stored-key, a finite state machine (FSM) based approach can be employed to achieve enhanced security against functional reverse-engineering. In this example, the programming is enabled on application of a predefined sequence of inputs. If the program state is reached on N transitions for an M bit input stream, the required number of trials is $2^{(M \cdot N)}$. For an 8-bit input and 16 state transitions, a complexity is $2^{128}$. However, a possible drawback of using FSM is that an adversary in the foundry may clone the design with the FSM. The proposed post-fabrication programming of the key in NVM with disabled access paths makes the pin locking resistant to such foundry level attacks.

Figure 12:
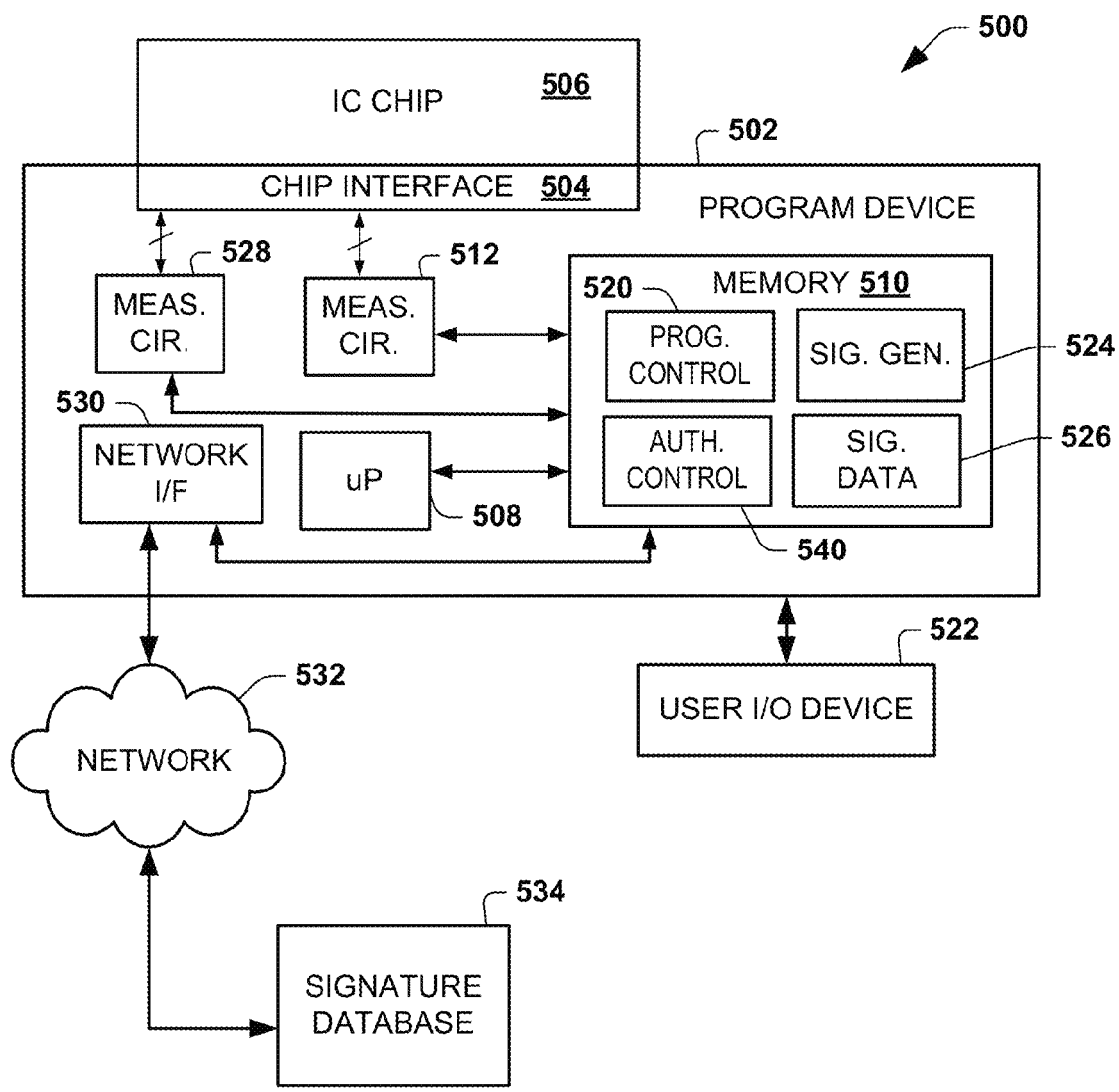
FIG. 12 depicts an example of a system for unlocking and authenticating an IC chip.

FIG. 12 depicts an example of a programming system 500 that can be utilized to program an IC chip from a locked condition to an unlocked condition according to one or more of the examples disclosed herein. Additionally, the system 500 can be utilized to generate a signature for the IC chip that can be utilized to verify the authenticity of the IC chip to mitigate counterfeiting.

In the example of FIG. 12, the system 500 includes a programming device 502 that includes a chip interface 504 to which one or more IC chips 506 can be coupled. For example, the chip interface can include a chip receptacle configured according to the pin out configuration of the IC chip so as to electrically connect with each or selected subset of the pins of the IC chip. The program device 502 can be implemented as including a microprocessor 508 and memory 510. The memory 510 can store instructions and data, which can be accessed by the microprocessor 508 for implementing the programming and signature generation disclosed herein. The programming device 502 can be provided or use program code that is proprietary for a given chip design. Through mathematical analysis and experimental measurements with example chips, it can be demonstrated that deciphering the unlocking key can be practically infeasible in realistic scenario.

The program device 502 further can be configured to include or to access program circuitry 512. The program circuitry 512 can be coupled to one or a select subset of the pins of the IC chip 506 via the chip interface 504. The program circuitry 512 is configured to program an arrangement of antifuses and/or fuses implemented in the IC chip 506 to unlock the chip. For example, the program circuitry 512 can activate an arrangement of antifuses and/or AF-FU pairs based on program data stored in the memory 510. The program data can specify an input sequence of codes such as a multi bit binary sequence. The input code can be provided to one or more multiplexed input pins for a comparison with an on chip authentication key that is stored in non volatile memory (e.g., see FIGS. 9 and 10). In other examples, the program circuitry 512 can be programmed to selectively supply program signals to a selected set of pins via the chip interface 504 for selectively providing program parameters (e.g., voltage, current and duration of program signal) to a selected set of two or more pins. As disclosed herein, the antifuses can be connected to respective pins to acquire programming signals at different sets of the pins to unlock the antifuses for enabling normal operation of the IC chip 506.

As a further example, the memory 510 can include program control 520 that is supplies the instructions to control the program circuitry 512 to perform the chip unlocking function disclosed herein. Additionally or alternatively, the system 500 can employ the user input device such as a key pad, keyboard, mouse or other user input device for inputting an appropriate security code to enable the program control to provide the predetermined program signals for unlocking the IC chip. In this way, the program control 520 can implement an additional level of security to acquire a validation code to be entered via the user input device 522.

The program device 502 can also include a signature generator 524 that generates signature data 526 that can be utilized to authenticate the IC chip 506. The authentication can occur before, concurrent with or following the unlocking of the IC chip via the program circuitry 512. As an example, measurement circuitry 528 can measure resistance across the one or more antifuses that have already been unlocked. As mentioned, each unlocked antifuse has a unique resistance, such as measurements across a plurality of antifuses can be combined to generate chip specific signature. For example, the measurement circuitry 528 can include a resistance measuring device (e.g., an ohm meter or current sense resistor) that measures the resistance or impedance across a plurality of pins, which provide a path through or have a resistance influenced by one or more respective antifuses. The measurement circuitry 528 can provide a value corresponding to the measured resistance for each reading of the IC chip 506 to the memory 510. A signature generator 524 can utilized a set of measurements across different combinations of the pins to generate a unique signature for each chip, which is stored in the memory 510 as the signature data 526. The signature data 526 thus can represent a unique signature for the IC chip 506 that is unique according to the resistance values measured for a selected set of the unlocked antifuses. While in the example of FIG. 12 the programming function for unlocking the IC chip 506 (e.g., generally corresponding to elements 520, 512 and 504) and the signature generating function (e.g., generally corresponding to elements 524, 526, 528 and 504) are demonstrated as residing in a common device 502, in other examples, such functions could be implemented in separate devices.

By way of example, the signature generator 524 can generate the chip-specific signature. The signature can be stored in local memory as well as provided to a remote signature database 534 via a network interface 530. For instance, the remote signature database 534 can be a secure server that is maintained by the chip manufacturer to maintain an aggregate set of signatures for chips that it sells. As mentioned, for each chip, the programmed AF resistances are measured in the corresponding pin output modes at particular read voltage/current values. The pins can be a selected set of pins that the manufacturer or other trusted party used to generate an authentic signature that is stored in the remote database 534.

An example of a signature generation protocol that can be implemented by the signature generator and associated measurement circuitry can be as follows:

Signature Generation (Same $I_{pp}$ for all AFs)
Input: $[R_i]$, the resistance vector of chip,
    for all $i \subseteq (1, \ldots, M)$, M←no. of auth. pins
Initialization: C←0
for all $i \subseteq (1, \ldots, M-1)$,
for all $j \subseteq (I, \ldots, M)$,
C←C+1
Comparison: If $R_i >= R_j$
$P_s[C]=1$
else
$P_s[C]=0$
end
end
Output: Sig=$[P_s[k]]$ for all $k \subseteq (1, \ldots, MC_2)$ The inputs to the chip signature generator are the measured program resistances of the authentication pin AFs, typically programmed at a predetermined low value of current to enhance the intrinsic variation and hence the signature uniqueness. As AF resistances of a chip are programmed at the same $I_{pp}$ (same mean value of distribution) and would experience approximately equal fabrication/programming related biases if any (analogous to inter-die variation of transistor properties), a simple comparison based scheme is utilized to create the signatures. Any two authentication AF program resistances, chosen in a predetermined sequence for all chips, are compared to create a 1 or 0 signature bit. This method also enhances the number of elements of the signature space according to combinatorics. Another advantage of the comparison based scheme is the robustness to any irreversible variations of AF program resistances with temperature, which might occur at any time between the instant the chip is released into market and the time they are measured by a system designer. Although much smaller than metal based interconnects, programmed MIM AFs exhibit a non-negligible positive linear temperature coefficient of resistance in the program current ranges. For example, for $I_{pp}$=10 mA, the MIM AF program resistance increases by a maximum of 4% from 25°-80°. The comparison based signature generation can eliminate the effect of temperature related variations.

The device 500 can also include authentication logic 540. The authentication logic 540 can be used to authenticate the IC chip. For instance, the authentication logic 540 is programmed to compare the signature generated by the signature generator 524 from the measured resistance values for the IC chip 506 to the stored signatures in the remote database 534. The authentication logic 540 can determine if the generated signature matches a previously generated signature for the IC chip. If the new signature matches a stored signature, the chip 506 can be identified as authentic. However, if the new signature does not match a stored signature (with in an expected amount of variation), then the authentication logic can identify the IC chip 506 as being cloned. While the authentication logic is shown as part of the program device 502, in other examples, the authentication logic 540 could be implemented at the remote database 534 or another remote server connected to the network 532.

Additionally or alternatively, the authentication logic 540 can be configured to control the measurement circuitry 528 to measure resistance associated each of the antifuses. If the measurements are in the high resistance (open circuit state) for any or all of the antifuses, the authentication logic can identify the chip as being used (i.e., not new). This measurement to determine if the chip 506 is new or used can be implemented before activating the program circuitry 512 to unlock the IC described above.

In view of the foregoing, it will be appreciated that this disclosure describes using one or more antifuse (AF) locking units (e.g., on-die, on-package or both), to ensure protection against two major forms of counterfeiting (e.g., recycling and/or cloning). For example, the approach herein provides an active defense scheme to provide protection against recycling is ensured by, where AF devices (normally open and one-time programmable) are integrated along one or select number of I/O signal paths to disable the corresponding pin functionality and render the chip useless until programmed by a trusted source. Thus, the AF locking mechanisms can operate as a tamper evident seal for detecting used, recycled chips.

In a die level implementation, protection against cloning can be ensured by a one-time programmable authentication key (e.g, an IC family specific key) to enable the lock AF programming. In package level implementations, intrinsic variations of resistance of already programmed AFs (separate from locked AFs) can be utilized to create unique chip-specific signatures for authentication and hence afford protection against cloning. The anti-recycling and anti-cloning protection afforded by the AF-based locking mechanisms disclosed herein thus can be utilized to provide two complementary security schemes.

Similar to other anti-counterfeiting schemes, the AF locking mechanism disclosed herein seamlessly fits in the current semiconductor business model. The proprietary programming device would reside only in the hands of the trusted parties e.g., a system designer (e.g., computer manufacturer) or a last level retailer (e.g., Digikey). They would unlock the chips and utilize them in their systems or supply to the end customer respectively.

What have been described above are examples. It is, of course, not possible to describe every conceivable combination of components or methods, but one of ordinary skill in the art will recognize that many further combinations and permutations are possible. Accordingly, the invention is intended to embrace all such alterations, modifications, and variations that fall within the scope of this application, including the appended claims. Where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, the term "including" means including but not limited to. The term "based on" means based at least in part on.

What is claimed is:

1. A locking system for an integrated circuit (IC) chip, the system comprising:
an arrangement of at least one antifuse in a signal path of the IC chip, the at least one antifuse being configured to operate in a first state, corresponding to a normally open switch, to inhibit normal operation of the IC chip, the at least one antifuse device configured to transition from the first state to a permanent second state, corresponding to a closed switch, in response to a program signal applied to at least one terminal of the IC chip to enable the normal operation of the IC chip;
a program device configured to selectively apply at least one program signal to a selected subset of terminals of the IC chip to transition the at least one antifuse from the first state to the permanent second state;
measurement circuitry to measure impedance across signal paths that include or are electrically influenced by at least one of the plurality of antifuse devices in the IC chip; and
authentication logic to determine if the IC chip is recycled based on the impedance measurements or in response to detecting the at least one antifuse has already been programmed to the permanent second state.

2. The system of claim 1, wherein the at least one antifuse further comprises a plurality of antifuse devices in the IC chip, each of the plurality of antifuse devices being configured to transition from the first state to the permanent second state in response to a series of program signals applied to a selected subset of terminals of the IC chip.

3. The system of claim 2, wherein the plurality of antifuse devices reside in input/output circuitry on a die of the IC chip between respective die pads and other circuitry.

4. The system of claim 2, wherein the plurality of antifuse devices reside in a packaging layer of the IC chip.

5. The system of claim 4, wherein each the plurality of antifuse devices is connected between a respective electrical connector of the IC chip and a respective die pad in the IC chip.

6. The system of claim 1, further comprising a fuse connected in parallel with each antifuse, wherein the fuse operates as a normally closed switch until activated to operate permanently as a normally open switch.

7. The system of claim 6, wherein each fuse in parallel with the antifuse provides a short circuit path for testing and validation of the IC chip prior to be programmed to operate permanently as the normally open switch.

8. The system of claim 1, further comprising at least one programming fuse connected with each antifuse device, wherein each programming fuse operates as a normally closed switch until activated to operate permanently as a normally open switch.

9. The system of claim 1, wherein the IC chip further comprises:
memory to store a preprogrammed authentication key; and
comparison circuitry to compare the preprogrammed authentication key with an input key entered via at least one pin of the IC chip to authenticate the IC chip.

10. The system of claim 1, wherein the at least one antifuse further comprises a plurality of antifuses in the IC chip, the program device being configured to selectively apply at least one program signal to a selected subset of terminals of the IC chip to transition each of the plurality of antifuses from the first state to the permanent second state.

11. A locking system for an integrated circuit (IC) chip, the system comprising:
an arrangement of at least one antifuse in a signal path of the IC chip, the at least one antifuse being configured to operate in a first state, corresponding to a normally open switch, to inhibit normal operation of the IC chip, the at least one antifuse device configured to transition from the first state to a permanent second state, corresponding to a closed switch, in response to a program signal applied to at least one terminal of the IC chip to enable the normal operation of the IC chip;
wherein the at least one antifuse further comprises a plurality of authentication antifuse devices in the IC chip in the permanent second state, and
the system further comprising a signature generator to generate a unique signature for the IC chip based on a series of impedance measurements across signal paths that include or are electrically influenced by at least one of the plurality of authentication antifuse devices in the IC chip.

12. The system of claim 11, further comprising an interface adapted to send the signature to a remote signature database.

13. The system of claim 12, further comprising authentication logic to determine if the IC chip is counterfeit based on comparing the generated unique signature with a stored signature in the remote signature database.

14. The system of claim 1, wherein each antifuse structure comprises one of a nanoelectromechanical antifuse or a metal-insulator-metal antifuse.

15. An integrated circuit (IC) chip apparatus comprising:
a die that includes die pads and circuitry designed to propagate electrical signals;
a package that encases the die and includes a plurality of connection terminals to provide for at least one of input or output of electrical signals with respect to the IC chip;
at least one antifuse configured as an anti-counterfeiting measure to operate in a first state, corresponding to a normally open switch, to inhibit normal operation of the IC chip, the at least one antifuse device configured to transition from the first state to a permanent second state, corresponding to a closed switch, in response to a program signal applied to at least one of the plurality of connection terminals of the package to enable the normal operation of the IC chip,
wherein a series of impedance measurements across a selected set of signal paths that include or are electrically influenced by at least one of the plurality of authentication antifuse devices in the IC chip defines a unique signature for the IC chip.

16. The apparatus of claim 15, wherein each of the plurality of antifuses being configured to transition from the first state to the permanent second state in response to a series of program signals applied to a selected subset of terminals of the IC chip.

17. The apparatus of claim 16, wherein the plurality of antifuse devices reside on the die of the IC chip.

18. The apparatus of claim 16, wherein the plurality of antifuses reside in the package of the IC chip between the plurality of connection terminals and the die.

19. The apparatus of claim 15, wherein each antifuse comprises one of a nanoelectromechanical antifuse or a metal-insulator-metal antifuse.

20. A method of authenticating an integrated circuit chip, comprising:
- connecting the IC chip to a program device, the IC chip including at least one antifuse locking unit configured to operate in an unprogrammed state, corresponding to a normally open switch, to inhibit normal operation of the IC chip, or a programmed state, corresponding to a closed switch;
- measuring impedance for one or more signal paths that include or are electrically influenced by the at least antifuse device in the IC chip; and
- determining if the IC chip is counterfeit or authentic based on the measured impedance.

* * * * *